Figure 1A:
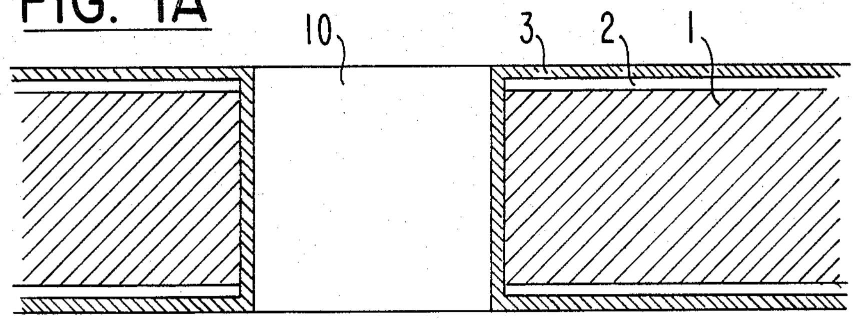

United States Patent [19]

Lundberg et al.

[11] Patent Number: 4,529,477

[45] Date of Patent: Jul. 16, 1985

[54] PROCESS FOR THE MANUFACTURE OF PRINTED CIRCUIT BOARDS

[75] Inventors: Werner Lundberg, Egebjergvej, Denmark; Helmut Winzer, Kevelaer, Fed. Rep. of Germany

[73] Assignee: Kollmorgen Technologies Corporation, Dallas, Tex.

[21] Appl. No.: 490,344

[22] Filed: May 2, 1983

[51] Int. Cl.[3] .................................... H05K 3/42

[52] U.S. Cl. .................................... 156/659.1; 156/901; 156/902; 427/54.1; 427/96; 427/97; 427/98

[58] Field of Search .................... 427/97, 96, 98, 54.1; 156/659.1, 902, 901

[56] References Cited

U.S. PATENT DOCUMENTS 4,323,593 4/1982 Tsunashima .......................... 427/97

4,324,815 4/1982 Mitani .................................. 427/96

*Primary Examiner*—John D. Smith

*Attorney, Agent, or Firm*—Morgan, Finnegan, Pine, Foley & Lee

[57] ABSTRACT

The process and device in accordance with the present invention allow the simple and economic manufacture of printed circuit boards, wherein the metal of the conductors as well as the one covering the hole walls is identical with the metal being etched away from the areas between the conductors.

According to this process, a one-or two-sided metal-coated base material is used which, upon production of the hole pattern, is provided in a known manner with a metal layer of desired thickness, covering the surface of the metal foil as well as the hole walls. Subsequently, a masking layer is applied by screen printing a positive image of the desired circuit pattern on the surface(s). In the following process step, the holes are filled with an ink by means of a screen printing stencil. In accordance with one embodiment of the invention, the ink used forms an etch-resistant surface film when drying. Upon etching, the masking layer as well as the surface film and the hole fillings are removed with a suitable solvent.

The screen printing stencil comprises a carrier screen fixed to a frame, said carrier screen being provided on its side facing the surface to be printed with a metal or plastic foil, said screen and foil being provided with holes at locations in proportion to the hole pattern in the base material.

9 Claims, 6 Drawing Figures

7
4
3
2
1

70
7
4
3
2
1
70

10
3
2
1

PROCESS FOR THE MANUFACTURE OF PRINTED CIRCUIT BOARDS

The present invention relates to a process for the manufacture of printed circuit boards provided with holes having metallized walls and, particularly, to such boards provided with copper conductors and copper-plated hole walls.

For manufacturing such printed circuit boards, a number of processes have been suggested. In one of those processes the conductors as well as the hole walls are provided with a metal layer serving as an etch-resist during the subsequent etching step and being removed afterwards. Preferred metals or metal alloys to be used as etch-resistant metal layers are such metals which can easily be removed without adversely affecting the copper surface as, for example, tin or tin/lead alloys.

Independent of the poor economy of such process, its high reject rates make it unsuitable for mass production; especially, it has proven to be difficult to achieve a copper surface with good solderability.

Furthermore, it has been suggested—for two-sided copper clad boards—to provide the holes in a first step and, subsequently, to deposit copper on the hole walls by electroless copper deposition or by electroless copper deposition followed by electroplating until a desired thickness of the copper layer on the hole walls and the surface of the base material is achieved. Subsequently, the surface of the base material is covered on both sides with a photoresist dry film of suitable thickness. Upon exposure through a positive of the desired printed circuit pattern and developing, an etch-resistant mask is formed which, on the one hand, covers the copper surface corresponding to the desired circuit pattern and, on the other hand, the holes thereby sealing them hermetically. The copper in the exposed areas is removed in a subsequent etching step. After removal of the masking layer, the circuit boards shows copper conductors and copper-clad hole walls well suited for soldering.

The high costs of suitable photoresist dry films and the photoprinting process itself constitute a considerable disadvantage of this process whenever conductor width and density would allow screen printing methods.

Therefore, it has been suggested, instead of using a photoresist dry film, to fill the holes with an etch-resistant ink using, for example, a squeegee. Before or after the removal of the said ink from the surface, the ink inside the holes is hardened by heat curing. Subsequently, an etch-resistant mask corresponding to the positive of the conductor pattern is applied by screen printing. After etching, the said etch-resistant mask as well as the hole fillings have to be removed. The removal of the dried and hardened ink from the surface prior to screen printing has proven to be a very tedious process, normally to be performed by precision polishing. Furthermore, it has also proven to be costly and difficult to remove all hole-fill left overs from the hole walls after etching. Therefore, this process is not suited for mass production purposes to achieve acceptable reject rates.

The process in accordance with the present invention avoids the problems and disadvantages described hereinabove and provides a safe and economic process for producing printed circuit boards with copper conductors and copper-clad hole walls.

In accordance with the present invention there is provided a process for the manufacture of printed circuit boards with metallized hole walls on any suitable insulating base material provided on one or both sides with a metal layer comprising the steps of providing said base material with those holes whose walls are metal-coated in the finished circuit board, and depositing a metal layer of desired thickness on the walls of said holes and the surface or selected areas of the surface of said base material in known manner, characterized in that a masking layer is applied to the metal-coated surface(s) of the base material by screen printing a positive image of the desired circuit pattern; and that the holes provided with metallized walls are subsequently filled with a resinous ink composition employing a screen printing stencil provided on the side facing the surface of the base material during use with a foil securely fixed to the screen of the stencil; and that the screen and the foil are provided with holes at locations corresponding to the holes with metallized walls in the circuit pattern; and that the resinous ink composition is pressed into the holes of the base material by means of a squeegee; and that the unmasked areas of the metal layer on the surface of the base material are etched away in known manner; and, finally, that the masking layer applied by screen printing and the said ink composition in the holes are removed by the agency of one or more suitable solvents.

A metal-clad base material, for example a two-sided copper-clad insulating base like, e.g., a laminate, hereinafter called base material, of suitable size, is provided with holes to be coated with a metal layer. Subsequently, a copper layer of desired thickness is deposited in a well known manner on the surface of the base material and the hole walls. Then, a masking layer corresponding to the desired printed circuit pattern is screen printed onto the base material, preferably using a scratch-resistant screen printing ink which is hardenable by UV radiation. Subsequently, the holes are filled with an etch-resistant material using a screen printing stencil in accordance with the present invention, the stencil being manufactured by fixing a suitable screen in a frame, the screen being provided on the side facing the surface to be printed with a foil of metal or plastic material of a thickness of 0.1 mm or less. In accordance with one embodiment of the present invention an aluminum foil is fixed to the screen by means of an adhesive.

Screen and foil are provided with holes, preferably by drilling, in a pattern which corresponds to the hole pattern of the finished circuit board. Preferably, the diameter of the holes in the screen and foil is larger than the diameter of the holes in the base material, but should not exceed the limit of the etch-resistant mask applied by screen printing. As a rule, the diameter of the holes in the screen and foil is only slightly in excess of the diameter of the holes in the base material.

In a further screen printing step, the ink for protecting the hole walls is pressed into the holes through the screen by means of a squeegee. Preferably, a protective ink is used which, under the influence of dry air and the oxygen contained therein, forms an etch-resistant surface film covering the holes, while the ink inside the holes remains almost or completely viscous. Thereby, the removal of the hole filling in a later process step is easily achievable using a solvent or a thinner for the respective ink.

For a better understanding of the scope of the invention, reference is made to the following description of the drawings.

FIGS. 1A to 1F show in a diagrammatic view the base material during the different process steps of the process in accordance with the invention.

FIG. 1A shows a partial view of the base material 1 covered on both sides with a copper foil 2. The walls of the holes 10 as well as the surface of the copper foil 2 are provided with a copper layer 3 deposited by methods well known in the art.

Figure 1B:
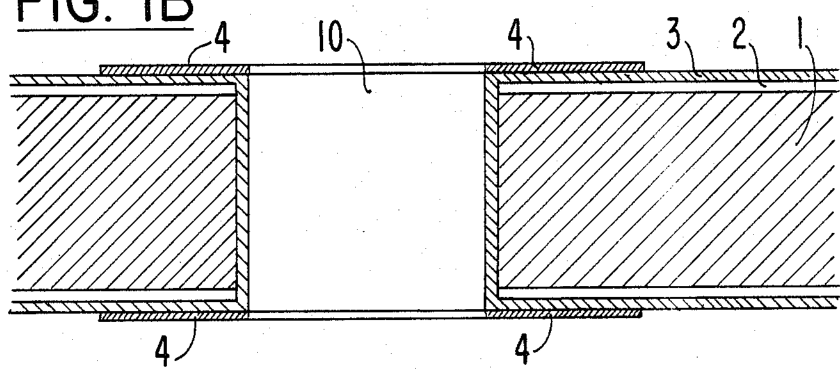

FIG. 1B is the partial view of the board of FIG. 1A after applying an etch-resistant mask 4 by screen printing.

Figure 1C:
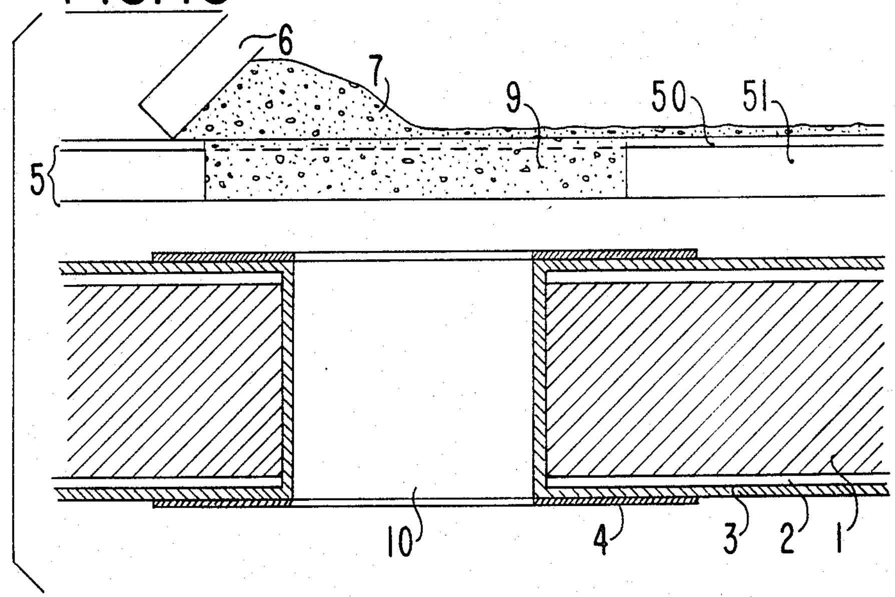

FIG. 1C is a diagrammatic view of the screen printing stencil 5 with the holes 9 in proportion to the holes 10 of the base material 1. The screen printing stencil 5 comprises the carrier screen 50 and the thereto adhered stencil foil 51. The hole 9 is already filled with the ink 7 by means of the squeegee 6.

Figure 1D:
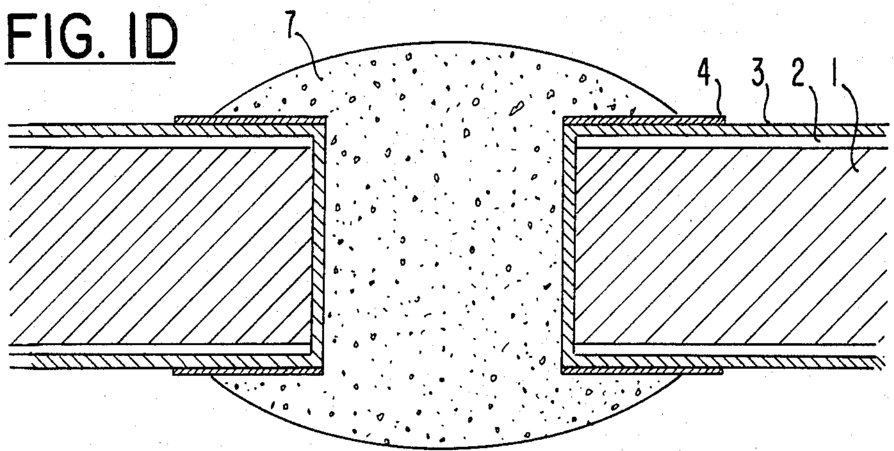

FIG. 1D shows the board 1 with the hole 10 filled with the ink 7.

Figure 1E:
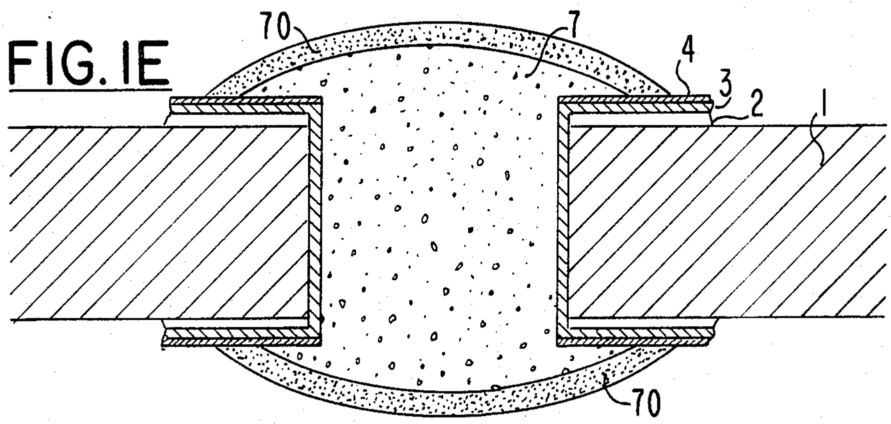

FIG. 1E shows the board of FIG. 1D after drying; the viscous-fluid ink filling 7 of hole 10 is covered by an etch-resistant film 70 formed on the surface of the filling 7.

Figure 1F:
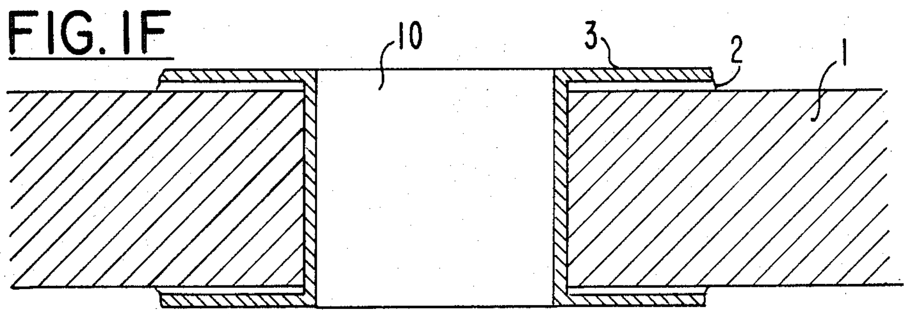

FIG. 1F shows the finished printed circuit board in accordance with the present invention after removal of the etch-resistant mask 4 (FIG. 1E) and the ink filling 7 including the film 70 from the hole 10. The copper conductors as well as the copper layer on the hole walls is of excellent solderability.

The present invention is neither limited to copper-clad base material nor to copperized hole walls. Furthermore, the metal layer on the surface of the insulating base material has not necessarily to be a laminated copper foil, but can be produced by electroless metal deposition as well as electroless metal deposition followed by electroplating.

The scope of the invention will be still better understood from the following examples.

EXAMPLE 1

The base material used in this example is a glass fiber reinforced epoxy resin laminate provided on both sides with a 35 $\mu$m thick copper foil. After the boards are cut to size, the manufacturing process comprises the following steps:

(1) Providing those holes in the base material whose walls are to be metallized;

(2) Brushing to remove the burr surrounding the hole wall edges;

(3) Cleaning with a cleaner conditioner at 70° C. for 5 minutes;

(4) Rinsing with water at 50° C. for 5 minutes;

(5) Slightly etching the copper foil surface with a solution of ammoniumpersulfate at 50° C. for 1 minute;

(6) Carefully rinsing in water;

(7) Immersing into a sodiumchloride precatalysing solution;

(8) Catalysing by immersing into a Sn(II)Pd(II)Cl catalysing solution at room temperature for 2 minutes;

(9) Rinsing;

(10) Immersing into a commercially available electroless copper deposition bath at room temperature for 45 minutes;

(11) Building-up the copper layer on the hole walls to 35 $\mu$m by electroplating;

(12) Rinsing and drying;

(13) Applying the etch-resistant mask corresponding to the desired circuit pattern by screen printing and air dry;

(14) Filling the holes by screen printing using the same ink as in step (13) and a screen printing stencil comprising a screen having adhered to its lower surface an aluminum foil of 0.8 mm thickness. The screen and the foil are provided with holes corresponding to the pattern of the finished board consisting of holes with metallized walls;

(15) Air-drying to form an etch-resistant film sealing the hole fillings;

(16) Etching in a hydrogenperoxyde-containing hydrochloride acidic copper chloride solution;

(17) Removing the etch-resistant mask as well as the hole fillings with trichlorethylene and a spray etcher.

EXAMPLE 2

The base material is an epoxy resin paper provided on both sides with an adhesive layer. The board is first provided with those holes whose walls are to be metallized. The adhesive layer is rendered wettable and microporous in a known manner. Subsequently, the surface including the hole walls are catalysed for the deposition of copper from electroless copper deposition baths; then, a thin copper layer is deposited from a commercially available electroless deposition bath. The further process steps are as described in Example 1, steps (11) through (17).

EXAMPLE 3

The process of Examples 1 or 2 is used; in step (13), however, a UV-curable screen printing ink is employed and the printed mask is cured by UV radiation.

EXAMPLE 4

The process of Example 3 is used, with the copper layer being produced solely by electroless copper deposition.

What is claimed:

1. A process for the manufacture of printed circuit boards with metallized hole walls on any suitable insulating base material provided on one or both sides with a metal layer comprising the steps of providing said base material with those holes whose walls are metal-coated in the finished circuit board, and depositing a metal layer of desired thickness on the walls of said holes and the surface or selected areas of the surface of said base material in known manner, characterized in that a masking layer is applied to said metal-coated surface(s) of said base material by screen printing a positive image of the desired circuit pattern; and that said holes provided with the metallized walls are subsequently filled with a resinous ink composition which, when drying, forms an etch-resistant film on the surface while the ink composition in the holes underneath the surface remains in a state of high viscosity by employing a screen printing stencil provided on the side facing the surface of said base material during use with a foil securely fixed to the screen of the stencil; and that said screen and said foil are provided with holes at locations corresponding to the holes with metallized walls in the circuit pattern; and that said resinous ink composition is pressed into the holes of said base material by means of a squeegee; and that the unmasked areas of the metal layer on the surface of said base material are etched away in known manner; and, finally, that the masked layer applied by screen printing and the said ink composition in said holes are removed by the agency of one or more suitable solvents.

2. The process of claim 1, characterized in that the holes in the screen stencil and the foil attached to it have a larger diameter than the holes in the base material, thus securing that, when applying the resinous ink composition to fill the holes, all areas not covered with the etching mask remain free of said resinous ink composition.

3. The process of claim 1 or 2, characterized in that the holes in the screen and the foil are produced by drilling.

4. The process of claim 1, characterized in that the screen printable ink composition(s) used for producing the etch-resistant masking layer is (are) hardened by UV-radiation.

5. The process of claims 1, 2, 3, or 4, characterized in that the metal layer covering the surface of the base material as well as the hole walls is copper.

6. The process of claim 1, characterized in that the foil of the screen printing stencil is fixed to the screen by means of an adhesive.

7. The process of claims 1 or 6, characterized in that said foil has a thickness of 0.1 mm or less.

8. The process of claims 1 or 6, characterized in that the foil is an aluminum foil.

9. The process of claims 1 or 6, characterized in that the foil is a plastic foil.

* * * * *